(12) United States Patent
Fujimoto (10) Patent No.: US 9,997,984 B2
(45) Date of Patent: Jun. 12, 2018

(54) DRIVING APPARATUS

(71) Applicant: PIONEER CORPORATION, Kanagawa (JP)

(72) Inventor: Kenjiro Fujimoto, Kanagawa (JP)

(73) Assignee: PINOEER CORPORATION, Kanagawa (JP)

( * ) Notice: Subject to any disclaimer, the term of this patent is extended or adjusted under 35 U.S.C. 154(b) by 211 days.

(21) Appl. No.: 15/105,811

(22) PCT Filed: Dec. 19, 2013

(86) PCT No.: PCT/JP2013/084145
§ 371 (c)(1),
(2) Date: Jun. 17, 2016

(87) PCT Pub. No.: WO2015/092907
PCT Pub. Date: Jun. 25, 2015

(65) Prior Publication Data
US 2017/0033674 A1   Feb. 2, 2017

(51) Int. Cl.
*H02K 33/18* (2006.01)
*G02B 26/08* (2006.01)
(Continued)

(52) U.S. Cl.
CPC ........... *H02K 33/18* (2013.01); *G02B 26/085* (2013.01)

(58) Field of Classification Search
CPC .. G02B 26/085; G02B 26/101; G02B 26/105; H02K 33/18; B81B 3/0018;
(Continued)

(56) References Cited

U.S. PATENT DOCUMENTS 4,553,118 A * 11/1985 Agatahama ........ H01H 51/2227
335/128
5,543,956 A * 8/1996 Nakagawa ........... G02B 26/085
310/36
(Continued)

FOREIGN PATENT DOCUMENTS

JP     11-231252    8/1999
JP     2003-057572  2/2003
(Continued)

OTHER PUBLICATIONS

International Search Report, PCT/2013/084145, dated Apr. 8, 2014.

*Primary Examiner* — Edgardo San Martin
(74) *Attorney, Agent, or Firm* — Young & Thompson

(57) ABSTRACT

A driving apparatus (101) is provided with: a first base part (110); a second base part (120); an elastic part (210) configured to couple the first base part with the second base part; a coil (300) disposed on the first base part; a first magnet (710) disposed on one side of the coil; a second magnet (720) disposed on an opposite side of the first magnet as viewed from the coil; a first middle yoke (810) provided on a surface of the first magnet opposed to the coil; and a second middle yoke (820) provided on a surface of the second magnet opposed to the coil. In particular, the first magnet is smaller than the second magnet. The first middle yoke is located closer to the coil than the second middle yoke is.

11 Claims, 10 Drawing Sheets

(51) Int. Cl.
  *G02B 26/10* (2006.01)
  *H01F 7/08* (2006.01)
  *G02B 26/00* (2006.01)
  *H01F 7/06* (2006.01)

(58) Field of Classification Search
  CPC .............. B81B 3/0021; B81B 3/0091; H01F 2007/083; H01F 2007/085; H01F 2007/081
  See application file for complete search history.

(56) References Cited

U.S. PATENT DOCUMENTS

| | | | | |
|---|---|---|---|---|
| 6,108,118 | A * | 8/2000 | Minamoto | G02B 26/105 310/36 |
| 6,122,089 | A | 9/2000 | Minamoto et al. | |
| 6,392,776 | B1 | 5/2002 | Murakami et al. | |
| 6,456,413 | B1 * | 9/2002 | Asada | G02B 7/1821 359/198.1 |
| 6,775,043 | B1 | 8/2004 | Leung et al. | |
| 6,803,843 | B2 * | 10/2004 | Kato | G02B 7/1821 200/181 |
| 6,924,915 | B2 * | 8/2005 | Hirose | B81B 3/0018 310/36 |
| 7,012,737 | B2 * | 3/2006 | Iwasaki | G02B 26/085 359/224.1 |
| 7,476,999 | B2 * | 1/2009 | Friedland | G02B 26/105 310/264 |
| 7,777,927 | B2 * | 8/2010 | Mizoguchi | G02B 26/085 359/224.1 |
| 8,237,522 | B2 * | 8/2012 | Sprague | G02B 26/085 200/181 |
| 8,305,672 | B2 * | 11/2012 | Luanava | G02B 26/085 359/200.7 |
| 9,632,309 | B2 * | 4/2017 | Yasuda | G02B 26/085 |
| 2002/0191346 | A1 * | 12/2002 | Oki | G11B 5/5569 360/264.7 |
| 2004/0105139 | A1 | 6/2004 | Hirose et al. | |
| 2005/0047010 | A1 | 3/2005 | Ishiwata et al. | |
| 2012/0147444 | A1 | 6/2012 | Pinter et al. | |
| 2015/0097449 | A1 * | 4/2015 | Suzuki | G02B 26/10 310/37 |

FOREIGN PATENT DOCUMENTS

| | | |
|---|---|---|
| JP | 2004-110005 | 4/2004 |
| JP | 2013-222155 | 10/2013 |

* cited by examiner

Movable Part During V axis driving

Second base interferes with second middle yoke during V axis driving

FIG. 10B

Movable Part During V axis driving

Second base does not interfere with second middle yoke even during V axis driving

DRIVING APPARATUS

TECHNICAL FIELD

The present invention relates to a driving apparatus, such as, for example, a MEMS scanner, configured to drive a driven object, such as a mirror.

BACKGROUND ART

In various technical fields, such as, for example, a display, a printing apparatus, precision measurement, precision processing, and information recording/reproduction, research on a micro electro mechanical system (MEMS) device manufactured by a semiconductor fabrication technology is actively progressing. For the MEMS device as described above, a mirror driving apparatus having a microscopic structure (or a light scanner or a MEMS scanner) attracts attention, for example, in a display field in which images are displayed by scanning a predetermined screen area with laser entered from a light source, or in a scanning field in which image information is read by scanning a predetermined screen area with light and by receiving reflected light.

In the mirror driving apparatus, it is general that a coil and a magnet(s) are used to drive a mirror. In this case, due to an interaction between a magnetic field generated by applying current to the coil and a magnetic field(s) of the magnet(s), a force in a rotational direction is applied to the mirror. As a result, the mirror is rotated (refer to, for example, Patent Literature 1).

CITATION LIST

Patent Literature

Patent Literature 1: Japanese Patent Application Laid Open No. Hei 11-231252

SUMMARY OF INVENTION

Technical Problem

In the Patent Literature 1, magnetic fields are generated by arranging two magnets on sides of a coil. However, for example, if a MEMS scanner and the magnets are arranged to planarly overlap each other, an arrangement space for the magnets is limited in order to ensure a driving area of the MEMS scanner. On the other hand, it is desirable that the magnets apply magnetic fields with good balance for the MEMS scanner. It is thus not easy to appropriately layout the magnets, resulting in a complicated and bulky apparatus configuration.

The aforementioned problem is exemplified as one example of problems to be solved by the present invention. It is therefore an object of the present invention to provide a driving apparatus configured to realize an appropriate driving force in an easy configuration.

Solution to Problem

The above object of the present invention can be achieved by a driving apparatus provide with a first base part; a second base part; an elastic part configured to couple the first base part with the second base part; a coil disposed on the first base part; a first magnet disposed on one side of the coil; a second magnet disposed on an opposite side of the first magnet as viewed from the coil; a first middle yoke provided on a surface of the first magnet opposed to the coil; and a second middle yoke provided on a surface of the second magnet opposed to the coil, wherein the first magnet is smaller than the second magnet, and the first middle yoke is located closer to the coil than the second middle yoke is.

DESCRIPTION OF EMBODIMENTS

Hereinafter, a driving apparatus according to an embodiment will be explained in order.

<1>

The driving apparatus according to the embodiment provide with a first base part; a second base part; an elastic part configured to couple the first base part with the second base part; a coil disposed on the first base part; a first magnet disposed on one side of the coil; a second magnet disposed on an opposite side of the first magnet as viewed from the coil; a first middle yoke provided on a surface of the first magnet opposed to the coil; and a second middle yoke provided on a surface of the second magnet opposed to the coil, wherein the first magnet is smaller than the second magnet, and the first middle yoke is located closer to the coil than the second middle yoke is.

According to the driving apparatus in the embodiment, the first base part and the second base part are directly or indirectly coupled (in other words, connected) by the elastic part having elasticity (e.g. a spring part described later, etc.). Here, due to the elasticity of the elastic part, rigidity of the elastic part is preferably lower than that of one or both of the first base part and the second base part. In other words, it is preferable that the elastic part is deformed relatively more easily than one or both of the first base part and the second base part. To put it more differently, it is preferable that the elastic part is deformed relatively easily, while one or both of the first base part and the second base part are deformed relatively less easily.

The coil is disposed on the first base part. For example, the first base part is configured as a frame having an opening, and the coil is wound around the opening. Moreover, the first magnet is disposed on the one side of the coil, and the second magnet is disposed on the opposite side of the first magnet as viewed from the coil. In other words, the two magnets are arranged to sandwich the coil therebetween. Thus, magnetic fields caused by the two magnets are generated around the coil. It is therefore possible to generate Lorentz forces on the coil by applying a predetermined control current to the coil.

The surface of the first magnet opposed to the coil and the surface of the second magnet opposed to the coil are typically set to have different polarities. Specifically, if the surface of the first magnet opposed to the coil is an N pole, the surface of the second magnet opposed to the coil is set to be an S pole. Alternatively, if the surface of the first magnet opposed to the coil is the S pole, the surface of the second magnet opposed to the coil is set to be the N pole. In this case, if the control current is applied to the coil, Lorentz forces in different directions are generated on the first magnet side and the second magnet side of the coil. Such Lorentz forces operate as a driving force to rotate the first base part on which the coil is disposed. Such a driving force may be transmitted to the second base part via the elastic part coupled with the first base part.

The first middle yoke is provided on the surface of the first magnet opposed to the coil. Moreover, the second middle yoke is provided on the surface of the second magnet opposed to the coil. The first middle yoke and the second middle yoke preferably contain a soft magnetic material with high relative permeability, such as, for example, pure iron, permalloy, ferrosilicon, and Sendust. According to the first middle yoke and the second middle yoke as described above, magnetic flux generated by the first magnet and the second magnet can be preferably concentrated on the coil. It is therefore possible to improve the driving force applied to the coil.

Here, in particular, the embodiment is configured in such a manner that the first magnet is smaller than the second magnet. More specifically, the embodiment is configured in such a manner that a surface area of the first magnet on the coil side is narrower than a surface area of the second magnet on the coil side. In addition, the first middle yoke is located closer to the coil than the second middle yoke is. In other words, the middle yoke provided on the smaller magnet is located to closer to the coil than the middle yoke provided on the larger magnet is.

According to a configuration described above, due to the fact that the first magnet is smaller than the second magnet, a magnetic field applied to the coil by the first magnet is smaller than a magnetic field applied to the coil by the second magnet. However, since the first middle yoke provided on the first magnet is closer to the coil than the second middle yoke provided on the second magnet is, the first middle yoke has a higher magnetic flux concentration effect to the coil than the second middle yoke does. Therefore, a difference in magnitude of the magnetic fields due to the size of the first magnet and the second magnet is canceled by a difference in the magnetic flux concentration effect due to a difference in distance of the first middle yoke and the second middle yoke. As a result, magnetic fields with good balance can be applied to the coil. This allows the Lorentz forces generated on the coil to be set close to a couple of force, and can realize more preferable driving of the first base part.

It is considered that the magnetic fields with good balance can be realized by matching the size of the first magnet and the second magnet; however, it is sometimes hard to match the size of the two magnets, depending on a space in which the magnets can be arranged. Particularly as in the embodiment, in the aspect in which the second base part is connected to the first base part on which the coil is provided, it is most likely required to arrange members asymmetrically to the coil.

In the embodiment, however, as described above, even if there is a difference in size of the first magnet and the second magnet, the appropriate magnetic fields can be applied to the coil by adjusting the distance between the first middle yoke and the coil and the distance between the second middle yoke and the coil. It is therefore possible to apply an appropriate driving force to the coil, and to realize preferable driving.

<2>

In another aspect of the driving apparatus according to the embodiment, wherein the second magnet is disposed on the second base part side as viewed from the coil.

According to this aspect, the second magnet, which is a larger magnet, is disposed on the second base part side as viewed from the coil. In other words, the smaller magnet is disposed on the opposite side of the second base part as viewed from the coil.

Here, on the second base part side on which the second magnet is provided, there is necessarily a space for disposing the second base part. Thus, by using a space that planarly overlaps the second base part, it is easy to dispose the second magnet, which is relatively large.

On the other hand, considering that the second base part is driven by using a driving force transmitted from the first driving part, it is required to ensure an area in which the second base part is driven. However, a member that is desirably located closer to the coil (in other words, closer to the second base part as well) as in the middle yoke possibly hinders the driving of the second base part.

The second middle yoke provided on the second magnet, however, is set to have a larger distance to the coil than the first middle yoke has. Therefore, the second middle yoke is easily disposed at a distance to the extent that a driving area of the second base part is not prevented.

<3>

In the aspect in which the second magnet is disposed on the second base part side, as described above, wherein the first magnet has a first part and a second part, the first part being provided along a first side of the first base part that is not opposed to the second base part, the second part being provided along a second side adjacent to the first side, the second magnet has a third part and a fourth part, the third part being provided along a third side of the first base part that is opposed to the second base part, the fourth part being provided along a fourth side adjacent to the third side, the first part is smaller than the third part, and a part of the first middle yoke provided on a surface of the first part is located closer to the coil than a part of the second middle yoke provided on a surface of the third part is.

In this case, the first part of the first magnet is provided to be smaller than the third part of the second magnet. Specifically, the first part provided along the first side of the first base part (i.e. the side that is not opposed to the second base part) is provided to be smaller than the third part provided along the third side of the first base part (i.e. the side that is opposed to the second base part). Therefore, the second magnet disposed on the second base part side is larger than the first magnet. The size of the other second part and fourth part is typically substantially the same, but is not particularly limited.

On the other hand, the part of the first middle yoke provided on the surface of the first part is located closer to the coil than the part of the second middle yoke provided on the surface of the third part is. Therefore, a difference in magnitude of the magnetic fields due to the size of the first part and the third part is canceled by a difference in the magnetic flux concentration effect due to a difference in distance of the middle yokes respectively provided on the first part and the third part. Therefore, magnetic fields with good balance can be applied to the coil.

<4>

In another aspect of the driving apparatus according to the embodiment, wherein the first middle yoke and the second middle yoke are arranged not to planarly overlap the first base part and the second base part.

According to this aspect, it is possible to avoid that the first middle yoke and the second middle yoke hinder the driving of the first base part and the second base part. In other words, although the first middle yoke and the second middle yoke are arranged not to planarly overlap the first base part and the second base part, the first middle yoke and the second middle yoke can be arranged in a state of being closer to the first base part and the second base part in terms of level or height. It is therefore possible to effectively demonstrate a magnetic flux concentration function by the first middle yoke and the second middle yoke.

<5>

In another aspect of the driving apparatus according to the embodiment, further comprising a yoke inserted through an opening of the first base part.

According to this aspect, the magnetic flux can be concentrated on the coil by using the yoke inserted through the opening of the first base part. This can increase the Lorentz forces generated by applying the control current to the coil. In other words, it is possible to increase the driving force applied by the coil. The yoke preferably contains a soft magnetic material with high relative permeability, such as, for example, pure iron, permalloy, ferrosilicon, and Sendust, as in the first middle yoke and the second middle yoke.

In order to increase the magnetic flux concentration effect by the yoke, a distance between the yoke and the coil is preferably small. Thus, the yoke is preferably increased in a range that does not hinder the driving of the first base part on which the coil is disposed. The yoke preferably has a cross section having a similar shape to a shape of the opening of the first base part.

Moreover, the yoke is inserted, for example, from a lower side to an upper side of the first base part. In order to increase the magnetic flux concentration effect by the yoke, the yoke is preferably configured to extend upward to some extent. Thus, the yoke is preferably configured to be long in a range that does not hinder the driving of the first base part on which the coil is disposed.

<6>

In another aspect of the driving apparatus according to the embodiment, further comprising a driven part supported by the second base part.

According to this aspect, the second base part supports the driven part, which is configured, for example, as a mirror. At this time, the second base part supports the driven part in such a manner that the driven part can be driven (e.g. can be rotated or can be moved). More specifically, the second base part may support the driven part in the drivable aspect, for example, by the elastic part with elasticity coupling the second base part with the driven part.

According to the driving apparatus having such a configuration, the driven part can be preferably driven (e.g. rotated or moved). In other words, according to the driving apparatus having such a configuration, the driven part can be preferably driven (e.g. rotated or moved). Specifically, for example, if the first base part moves, the second base part coupled with the first base part via the elastic part also moves in association with the movement of the first base part. If the second base part moves, the driven part supported by the second base part also moves in association with the movement of the second base part. As a result, the driven part can be preferably driven.

EXAMPLES

Hereinafter, a driving apparatus according to an example of the present invention will be explained with reference to the drawings. Hereinafter, an explanation will be given to an example in which the driving apparatus is applied to a MEMS scanner. Needless to say, the driving apparatus according to the present invention may be applied to an arbitrary driving apparatus other than the MEMS scanner.

(1) Basic Configuration

Figure 1:
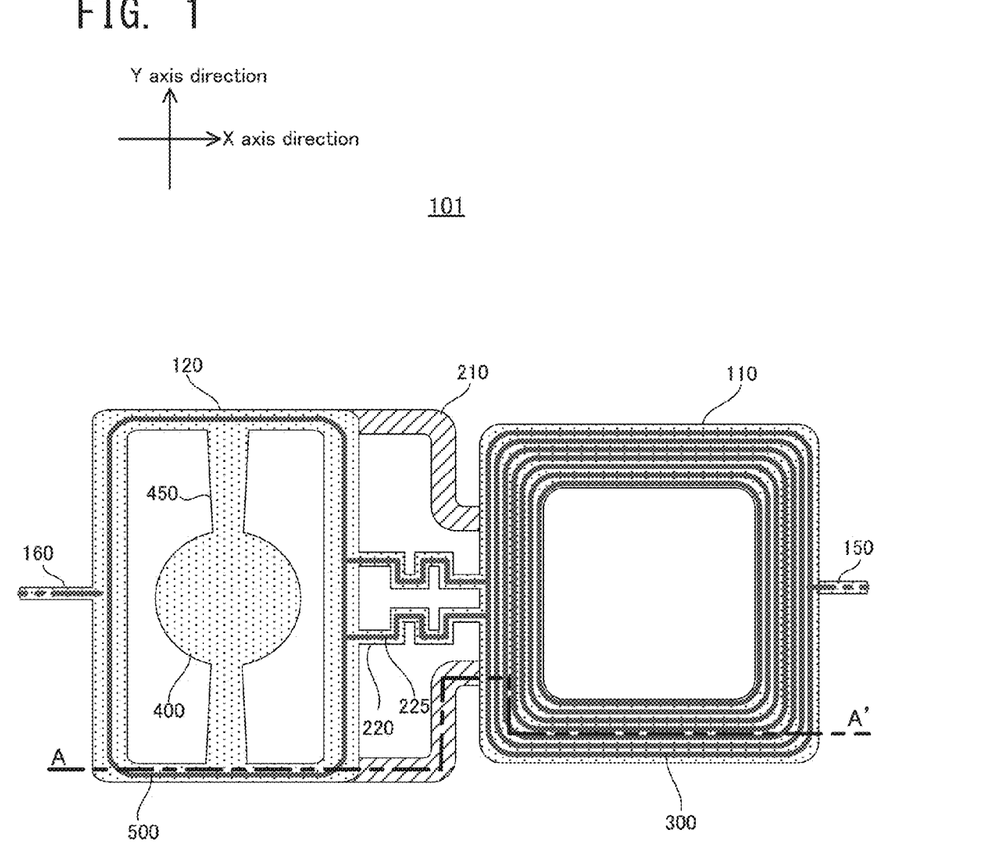
FIG. 1 is a plan view illustrating a configuration of a MEMS scanner according to an example when seen from a front side.
Figure 2:
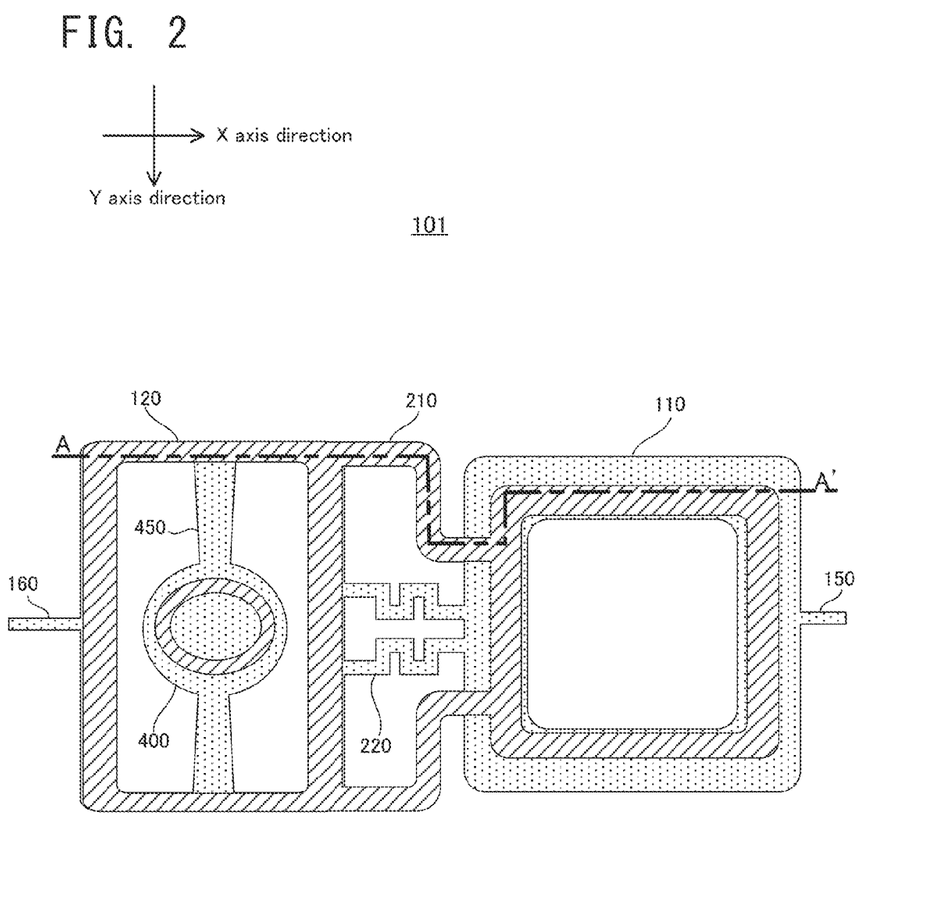
FIG. 2 is a plan view illustrating the configuration of the MEMS scanner according to the example when seen from a rear side.
Figure 3:
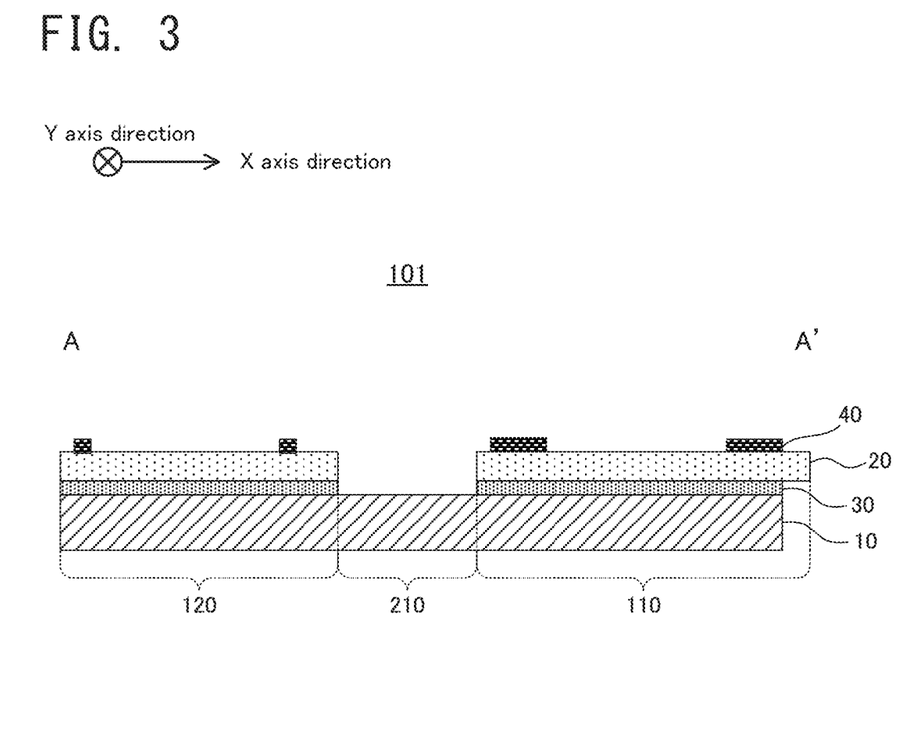
FIG. 3 is a cross sectional view illustrating a layered structure of the MEMS scanner according to the example.

Firstly, with reference to FIG. 1 to FIG. 3, a configuration of a MEMS scanner 101 according to an example will be explained. FIG. 1 is a plan view illustrating a configuration of the MEMS scanner 101 according to the example when seen from a front side. FIG. 2 is a plan view illustrating the configuration of the MEMS scanner 101 according to the example when seen from a rear side. FIG. 3 is a cross sectional view illustrating a layered structure of the MEMS scanner 101 according to the example.

As illustrated in FIG. 1 and FIG. 2, the MEMS scanner 101 according to the example is provided with a first base 110, a second base 120, V torsion bars 150 and 160, a spring part 210, a wiring spring part 220, a coil 330, a mirror 400, and a H torsion bar 450.

The first base 110 has a frame shape with a space (or an opening) therein. In other words, the first base 110 has a frame shape that has two sides extending in a Y-axis direction in FIG. 1 and two sides extending in an X-axis direction (i.e. in a direction perpendicular to the Y-axis direction) in FIG. 1, and that has a space surrounded by the two sides extending in the Y-axis direction and the two sides extending in the X-axis direction. In the example illustrated in FIG. 1 and FIG. 2, the first base 110 has, but not limited to, a square shape. For example, the first base 110 may have another shape (e.g. a rectangular shape such as an oblong shape, a circular shape, etc.). Moreover, the first base 110 is not limited to the frame shape.

On the first base 110, the coil 300 is disposed. The coil 300 is a wound wire that is wound a plurality of times and that contains, for example, a relatively highly conductive material (e.g. gold, copper, etc.). In the example, the coil 300 has a square shape along the first base 110. The coil 300, however, may have an arbitrary shape (e.g. an oblong, rhomboid, parallelogram, circular, oval, or another arbitrary loop shape).

A control current is supplied to the coil 300 from a power supply via a not-illustrated power supply terminal or the like. The power supply may be a power supply provided for the MEMS scanner 101, or may be a power supply provided outside the MEMS scanner 101. Magnets, which are not illustrated, are disposed around the coil 300, and a force in a rotational direction is applied due to an interaction between a magnetic field generated by applying the control current to the coil 300 and magnetic fields of the magnets. As a result, the first base 110 provided with the coil 300 is rotated in a direction according to the magnetic fields and the direction of the control current.

The second base 120 has a frame shape with a space therein, as in the first base 110. In the space of the second base 120, the mirror 400 is disposed. The mirror 400 is disposed to be hung or supported by the H torsion bar 450.

The H torsion bar 450 is an elastic member, such as a spring that contains, for example, silicon, copper alloy, iron-based alloy, other metal, resin, or the like. The H torsion bar 450 is disposed to extend in the Y-axis direction in FIG. 1. In other words, the H torsion bar 450 has a shape having long sides extending in the Y-axis direction and short sides extending in the X-axis direction. One end of the H torsion bar 450 is connected to the second base 120. The other end of the H torsion bar 450 is connected to the mirror 400. Thus, the mirror 400 can rotate around an axis along the Y-axis direction, which is a rotation axis, by the elasticity of the H torsion bar 450. The mirror 400 is one specific example of the "driven part".

The first base 110 and the second base 120 are coupled with each other by the spring part 210. The spring part 210 is one specific example of the "elastic part", and has a function of transmitting a driving force obtained from the coil 300 on the first base 110, to the second base 120. Moreover, the wiring spring part 220 is provided between the first base 110 and the second base 120. The wiring spring part 220 is provided to realize electrical connection between the first base 110 and the second base 120. Specifically, a connection wire 225 for connecting the coil 300 of the first base 110 and a wire 500 of the second base 120 is disposed on the wiring spring part 220.

The first base 110 and the second base 120 are respectively fixed to a not-illustrated substrate, support member or the like, via the V torsion bars 150 and 160 (in other words, the bases are fixed in the inside of a system that is the MEMS scanner 101). Alternatively, the first base 110 may be hung by a not-illustrated suspension or the like.

As illustrated in FIG. 3, the MEMS scanner 101 according to the example has a laminated structure of a support layer 10, an active layer 20, a BOX layer 30, and a metal layer 40. The MEMS scanner 101, however, may have a laminated structure including another layer.

Each of the support layer 10 and the active layer 20 contains, for example, silicon or the like. The BOX layer 30 contains an oxide film or the like, such as, for example, $SiO_2$, and is disposed between the support layer 10 and the active layer 20. The BOX layer 30 insulates the support layer 10 and the active layer 20. The metal layer 40 contains, for example, highly conductive metal, and is disposed on the active layer 20. The metal layer 40 constitutes the coil 300 of the first base 110, the wire 500 of the second base 120, the connection wire 225 of the wiring spring part 220, or the like.

The support layer 10 is formed to extend from the first base 110 to the spring part 210 and the second base 120 (specifically refer to FIG. 2). On the other hand, the active layer 20, the BOX layer 30, and the metal layer 40 are formed in both of the first base 110 and the second base 120, but are not formed in the spring part 210. In other words, the spring part 210 only includes the support layer 20. Moreover, the spring part 210 is integrally configured with the support layer 10 of the first base 110 and the support layer of the second base 120. The active layer 20 is not formed in the spring part 210, but the active layer 20 is formed in the wiring spring part 220 (refer to FIG. 1). This can realize the electrical connection between the first base 110 and the second base 120.

(2) Operation of MEMS Scanner

Figure 4A:
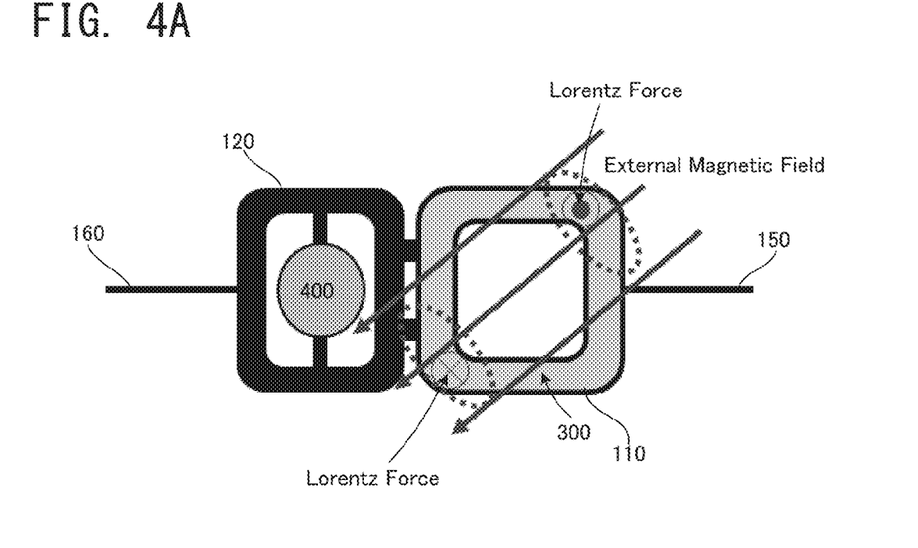
FIG. 4A to FIG. 4C are side views conceptually illustrating an aspect of an operation of the MEMS scanner according to the example.
Figure 4B:
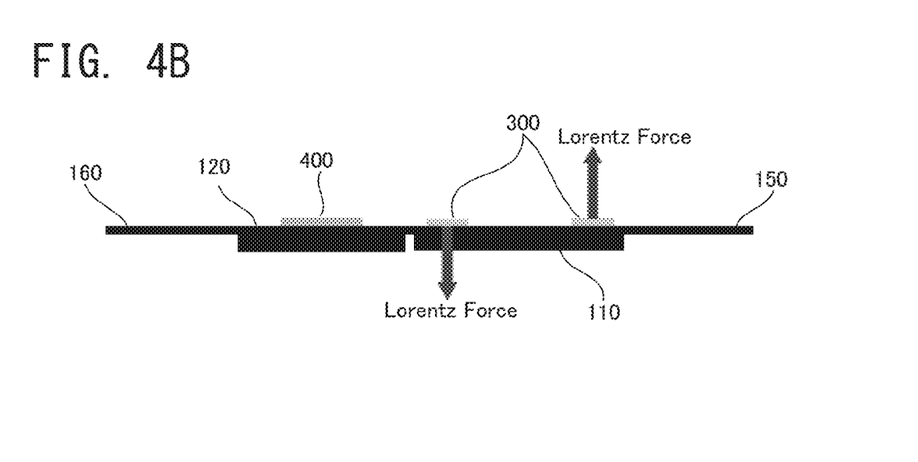
Figure 4C:
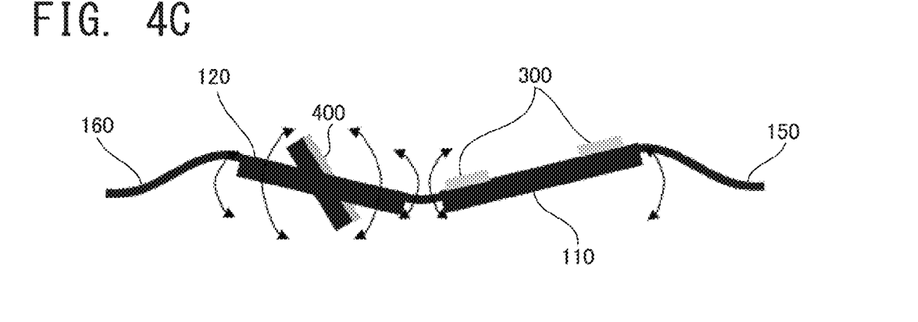

Next, with reference to FIG. 4A to FIG. 4C, the operation of the MEMS scanner 101 according to the example will be explained. FIG. 4A to FIG. 4C are side views conceptually illustrating an aspect of the operation of the MEMS scanner according to the example. In the drawings after FIG. 4A to FIG. 4C, for convenience of explanation, the detailed members that constitute the MEMS scanner 101 described in FIG. 1 to FIG. 3 or the like will be omitted, as occasion demands, and will be simply illustrated.

As illustrated in FIG. 4A, in the MEMS scanner 101 according to the example, an external magnetic field is applied to the coil 300 from an upper right direction to a lower right direction in the drawing. The external magnetic field is applied by magnets described later. The direction of the magnetic field, however, is one example, and may be applied in another direction.

In FIG. 4A and FIG. 4B, in operation of the MEMS scanner 101 according to the example, the control current is supplied to the coil 300. Then, Lorentz force is caused by an electromagnetic interaction between the magnetic field generated by supplying the control current to the coil and the external magnetic field. Specifically, Lorentz forces, which are opposite to each other, are generated on one end and the other end of the coil 300

If the Lorentz forces are generated, the first base provided with the coil 300 is driven. The driving force of the first base 110 is transmitted to the second base 120 via the spring part 210. Thus, in conjunction with the driving of the first base 110, the second base 120 is also driven. The driving force of the second base is also transmitted to the mirror 400 via the H torsion bar 450. Thus, in conjunction with the driving of the second base 120, the mirror 400 is also driven. As described above, due to the generation of the Lorentz forces on the coil 300, each of the first base 110, the second base 120, and the mirror 400 is driven.

Here, if frequency of the control current supplied to the coil 300 is DC about several hundred Hz, the MEMS scanner 101 rotates around an X axis. Specifically, the MEMS scanner 101 rotates around the V torsion bars 150 and 160, which are rotation axes. By this, the mirror 400 rotates around the X axis, which is a rotation axis, and so-called vertical scanning is performed.

As illustrated in FIG. 4C, if the control current supplied to the coil 300 has a frequency corresponding to a specific resonance mode, the MEMS scanner 101 rotates around a Y axis. Specifically, the first base 110 and the second base 120 of the MEMS scanner 101 respectively rotate around different axes along the Y axis, which are rotation axes. By this, the mirror 400 also rotates around the Y axis, which is a rotation axis, and so-called lateral scanning is performed.

During the driving described above, the Lorentz forces generated on the coil 300 are preferably a couple of force. Particularly, in the driving with the Y axis used as a rotation axis, a rotation center of the coil 300 is determined only from size, hardness, and weight of each part of the structure, and is influenced when external force is applied. If the Lorentz forces generated on the coil 300 are shifted from the couple of force, another motion (e.g. a translation motion of the coil 300) is mixed with a resonance motion, and this hinders a smooth resonance motion.

In order to set the Lorentz forces generated on the coil 300 close to the couple of force, the magnetic field applied to the coil 300 is preferably horizontal, and the both sides of the coil 300 (i.e. two areas in which the Lorentz forces are generated) preferably have about the same strength.

(3) Arrangement of Magnets and Yokes

Figure 5:
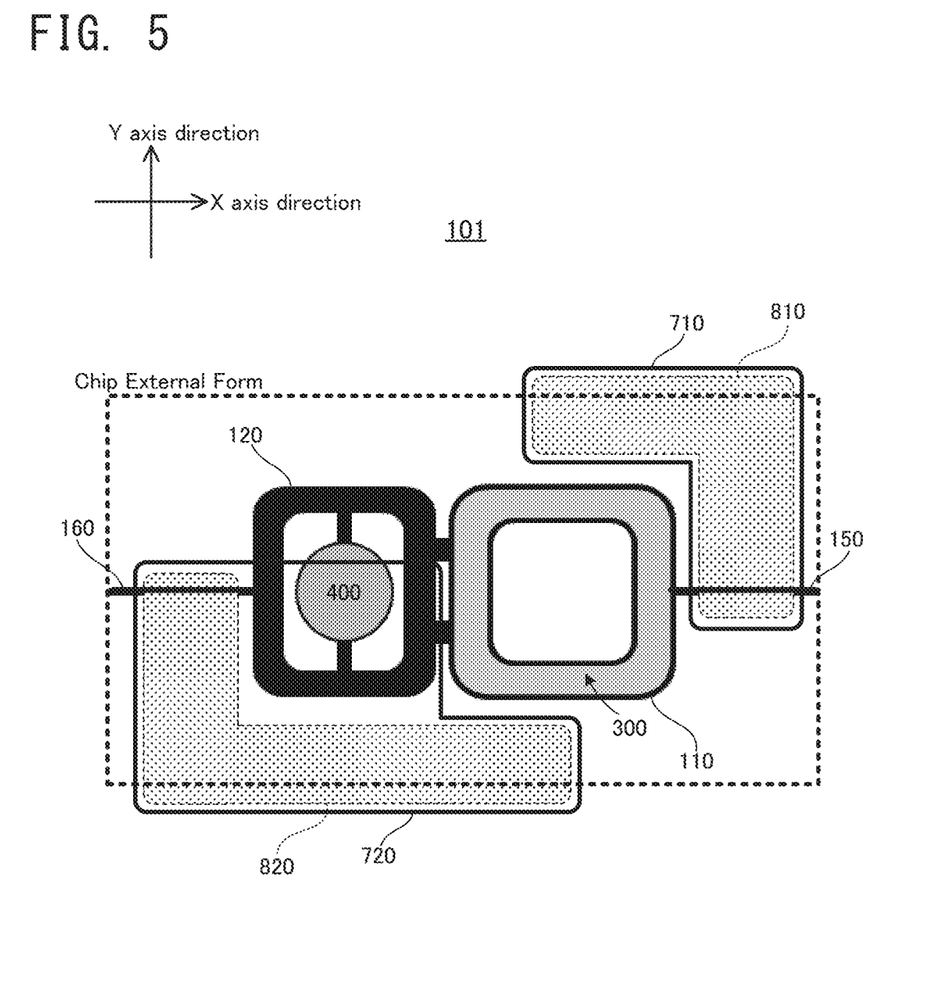
FIG. 5 is a plan view illustrating an arrangement of magnets and middle yokes with respect to the MEMS scanner according to the example.
Figure 6:
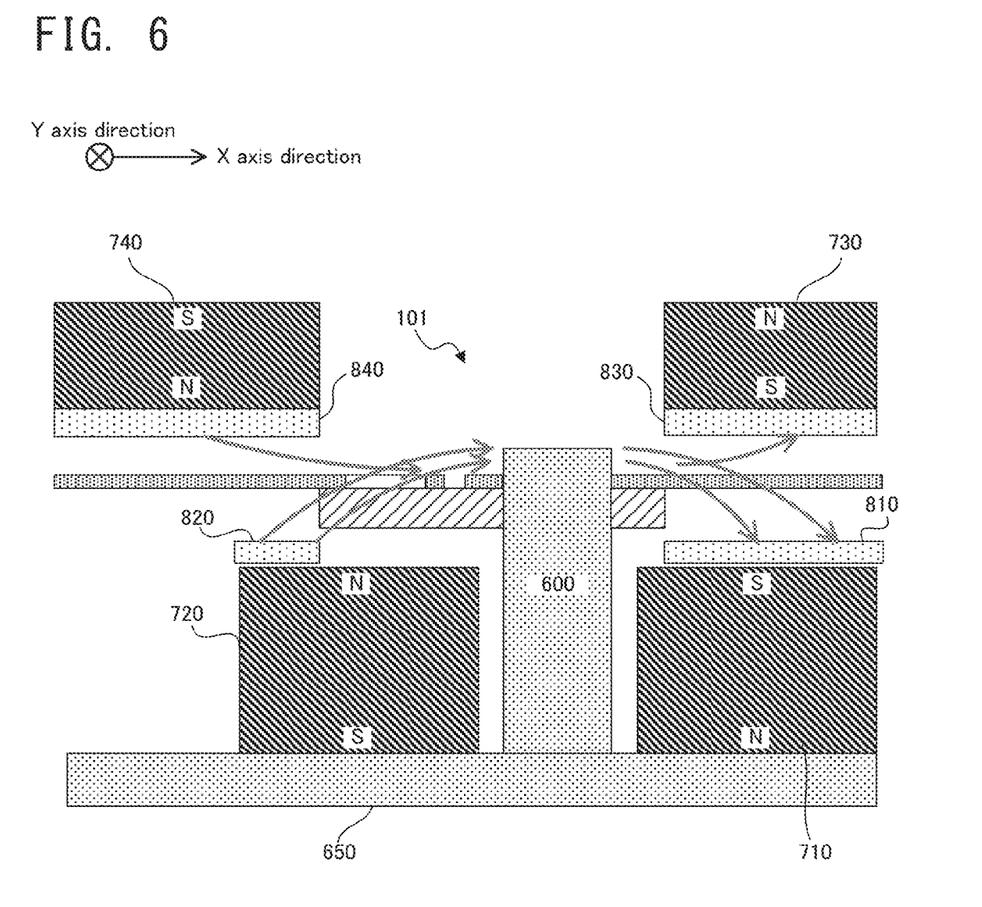
FIG. 6 is a cross sectional view illustrating a configuration of members configured to apply magnetic fields to the MEMS scanner according to the example.
Figure 7:
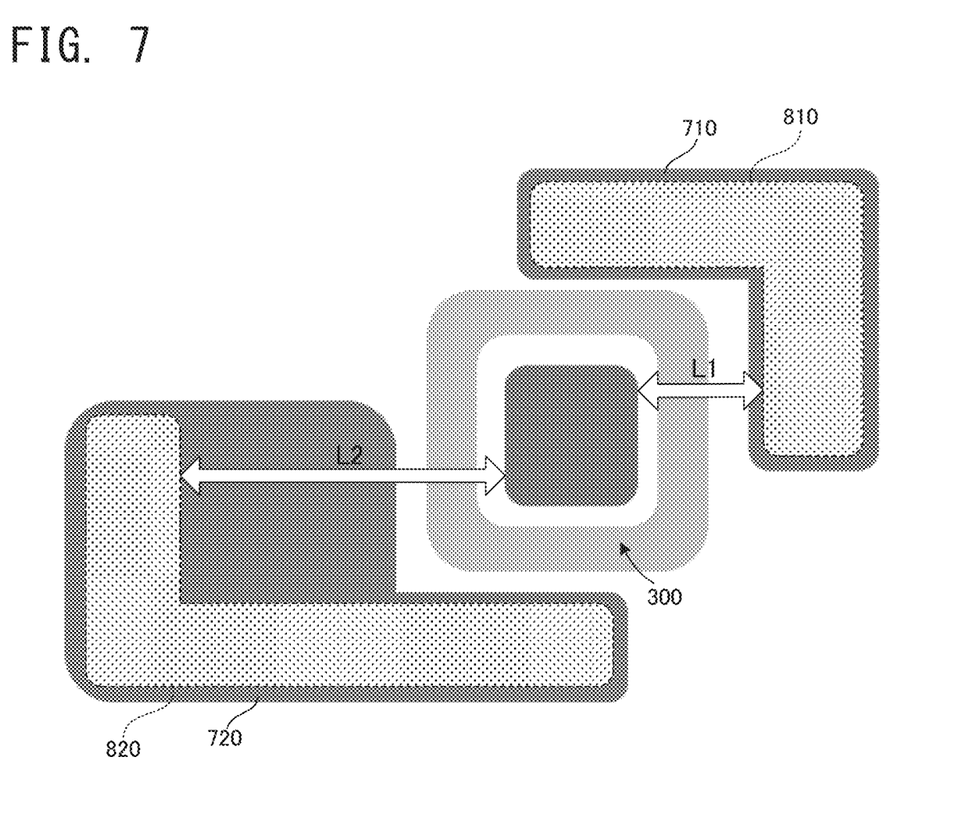
FIG. 7 is a conceptual view illustrating a positional relation of the members configured to apply the magnetic fields to a coil.

Next, configurations of yokes and magnets that generate magnetic fields with respect to the MEMS scanner 101 according to the example will be explained with reference to FIG. 5 to FIG. 7. FIG. 5 is a plan view illustrating an arrangement of magnets and middle yokes with respect to the MEMS scanner according to the example. FIG. 6 is a cross sectional view illustrating a configuration of members configured to apply magnetic fields to the MEMS scanner according to the example. FIG. 7 is a conceptual view illustrating a positional relation of the members configured to apply the magnetic fields to the coil.

In FIG. 5, according to the MEMS scanner 101 in the example, a first magnet 710 is disposed on one side of the coil 300 (on an upper right side of the drawing). The first magnet 710 has an L shape to be located along two sides of the first base 110 on which the coil 300 is provided. On a surface of the first magnet 710 opposed to the coil 300, a first middle yoke 810 is provided.

Moreover, a second magnet 720 is disposed on the other side of the coil 300 (on a lower left side of the drawing). The second magnet 720 has an L shape to be located along two sides of the first base 110 on which the coil 300 is provided (specifically, which are different from the two sides along which the first magnet 710 is located). On a surface of the first magnet 710 opposed to the coil 300, a first middle yoke 810 is provided. On a surface of the second magnet 720 opposed to the coil 300, a second middle yoke 820 is provided. The second magnet 720 is disposed by using a relatively large space, which ranges from below the second base 120 to below the V torsion bar 160. In other words, the second magnet 720 is configured to be a larger magnet than the first magnet 710. The second middle yoke 820 does not cover the entire surface of the second magnet 720, but is located not to planarly overlap the second base.

In FIG. 6, a yoke 600 extending upward from a lower yoke 650 is inserted through the coil 300. Moreover, a third magnet 730 and a fourth magnet 740 are disposed above the MEMS scanner 101. A third middle yoke 830 is provided on a surface of the third magnet 730 opposed to the coil 300. A fourth middle yoke 840 is provided on a surface of the fourth magnet 740 opposed to the coil 300.

Here, each of the yoke 600, the lower yoke 650, the first middle yoke 810, the second middle yoke 820, the third middle yoke 830, and the fourth middle yoke 840 described above contains a soft magnetic material with high relative permeability, such as, for example, pure iron, permalloy, ferrosilicon, and Sendust. According to the yokes, magnetic flux generated by the first magnet 710, the second magnet 720, the third magnet 730, and the fourth magnet 740 can be preferably concentrated on the coil 300 and can be made parallel. As a result, the driving force applied to the coil 300 can be improved.

In FIG. 7, in particular, the MEMS scanner 101 according to the example is configured in such a manner that a distance L1 is less than a distance L2, wherein L1 is a distance between the yoke 600 and a part of the first middle yoke 810 located along the right side of the coil 300 in the drawing, and L2 is a distance between the yoke 600 and a part of the second middle yoke 820 located along the left side of the coil 300 in the drawing. Thus, the first middle yoke 810 has a higher magnetic flux concentration function with respect to the coil 300 than the second middle yoke 820 does. Therefore, a difference in strength of the magnetic fields due to a difference in size between the first magnet 710 and the second magnet 720 is canceled by a difference in the magnetic flux concentration function due to a difference in distance of the first middle yoke 810 and the second middle yoke 820. In other words, L1 and L2, which are respectively a distance between the first middle yoke 810 and the yoke 600 and a distance between the second middle yoke 820 and the yoke 600, may be adjusted to be values that can cancel the difference in strength of the magnetic fields of the first magnet 710 and the second magnet 720.

As a result, the magnetic fields with good balance are applied to the coil 300. It is therefore possible to set the Lorentz forces generated on the coil 300 during driving close to the couple of force, and to realize more preferable driving.

(4) Comparison with Comparative Examples

Figure 8:
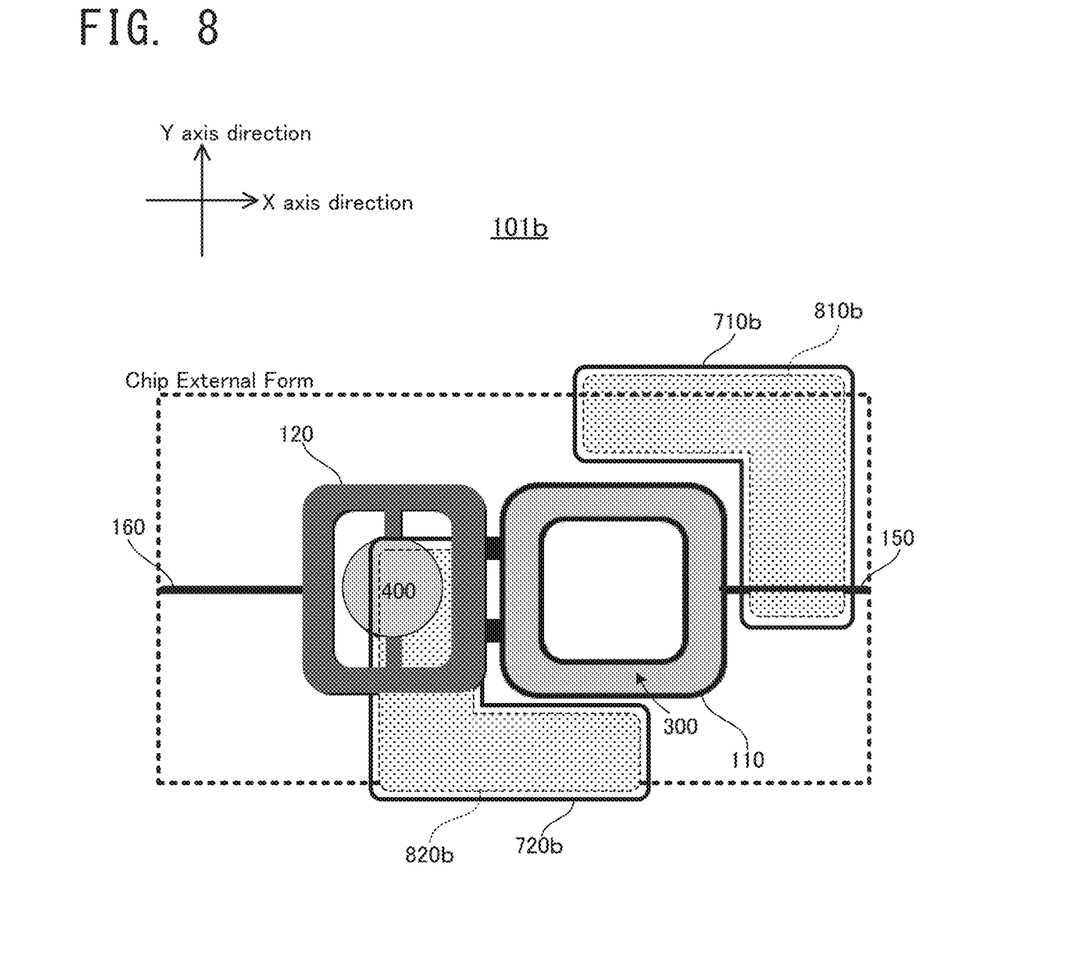
FIG. 8 is a plan view illustrating an arrangement of magnets and middle yokes with respect to a MEMS scanner according to a first comparative example.
Figure 9:
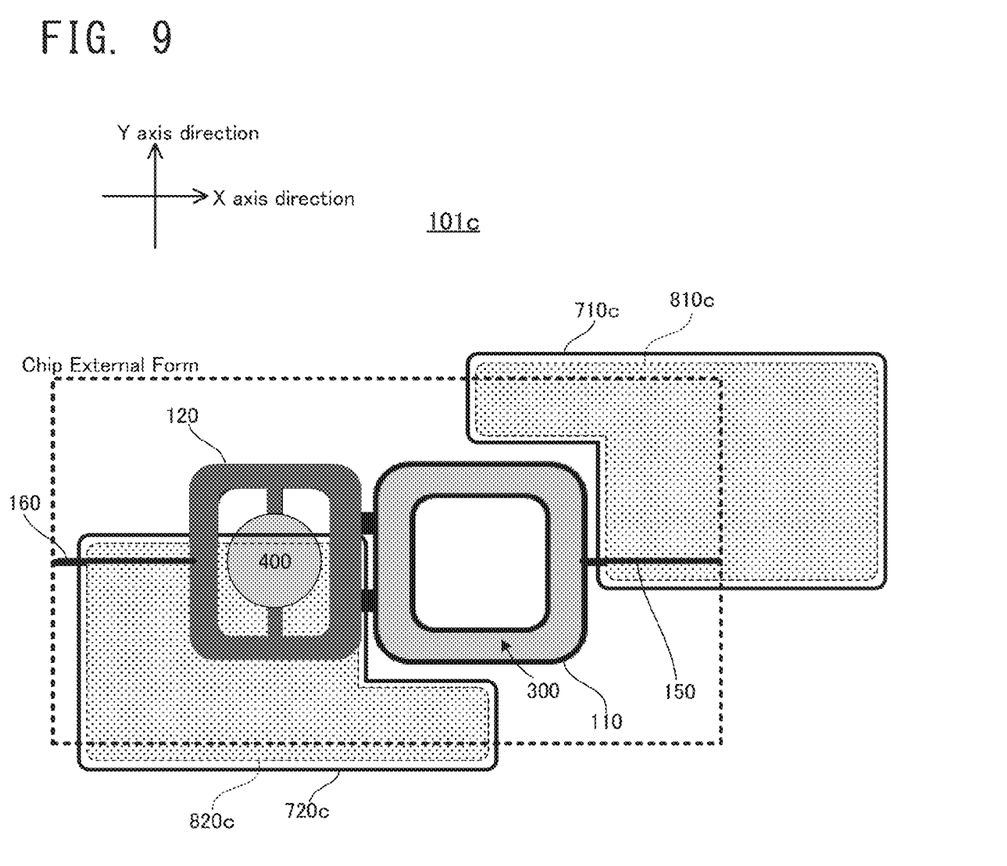
FIG. 9 is a plan view illustrating an arrangement of magnets and middle yokes with respect to a MEMS scanner according to a second comparative example.

Next, a specific explanation will be given to advantageous points of the MEMS scanner 101 according to the example, in comparison with a MEMS scanner 101*b* according to a first comparative example and a MEMS scanner 101*c* according to a second comparative example, which are explained with reference to FIG. 8 to FIG. 10B. FIG. 8 is a plan view illustrating an arrangement of magnets and middle yokes with respect to the MEMS scanner according to the first comparative example. FIG. 9 is a plan view illustrating an arrangement of magnets and middle yokes with respect to the MEMS scanner according to the second comparative example.

In FIG. 8, a first magnet 710*b* and a first middle yoke 810*b* according to the first comparative example are provided to be the same as the first magnet 710 and the first middle yoke 810 of the MEMS scanner 101 according to the example (refer to FIG. 5). On the other hand, a second magnet 720*b* and a second middle yoke 820*b* according to the first comparative example are provided to be smaller than the second magnet 720 and the second middle yoke 820 of the MEMS scanner 101 according to the example (refer to FIG. 5). Specifically, the first magnet 710*b* and the second magnet 720*b* according to the first comparative example have substantially the same size as each other, and are configured to apply substantially the same magnetic field to the coil 300.

In the first comparative example, however, the second magnet 720*b* has a smaller size than that in the example, and driving efficiency thus deteriorates. Specifically, an empty space on the left side of the second base 120 cannot be efficiently used, and thus, the magnet field applied to the coil 300 is weaken by that much, and the Lorentz forces generated on the coil 300 are reduced.

In FIG. 9, a first magnet 710*c* and a first middle yoke 810*c* according to the second comparative example are provided to be larger than the first magnet 710 and the first middle yoke 810 of the MEMS scanner 101 according to the example (refer to FIG. 5). On the other hand, a second magnet 720*c* according to the second comparative example is provided to be the same as the second magnet 720 of the MEMS scanner 101 according to the example. The second middle yoke 820*c* according to the second comparative example is not partially provided as in the second middle yoke 820 according to the example, but is provided to cover the entire surface of the second magnet 720*c* on the coil 300 side. Therefore, even in the second comparative example, as in the first comparative example described above, the first magnet 710*c* and the second magnet 720*c* have substantially the same size as each other, and are configured to apply substantially the same magnetic field to the coil 300.

In the second comparative example, however, the first magnet 710*c* has a larger size than that in the example, and thus protrudes out of a chip. This increases a device size including a magnetic circuit, causing a bulky apparatus.

Figure 10A:
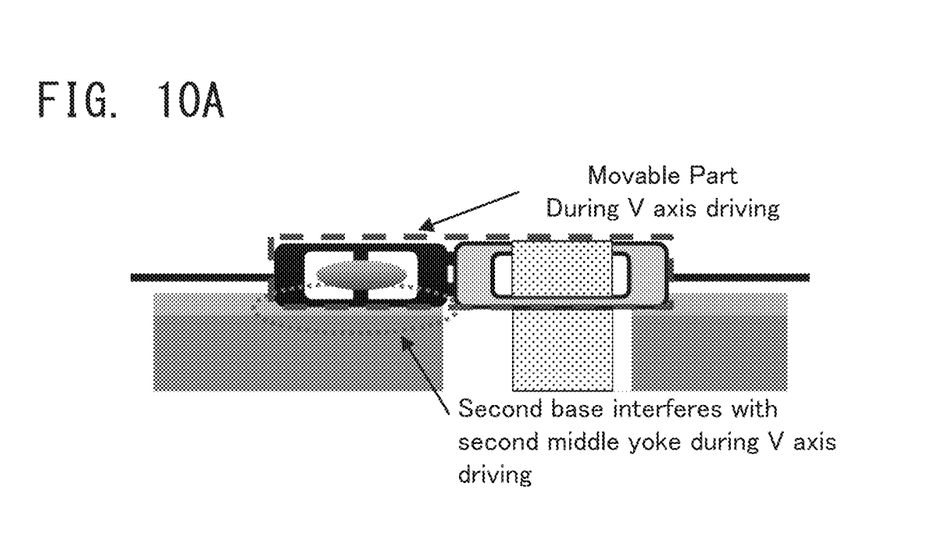
FIG. 10 is a conceptual view explaining presence of interference with the middle yoke during V-axis driving.

In FIG. 10A, moreover, in the first comparative example and the second comparative example, the second middle yoke 820*b* or 820*c* is located to planarly overlap the second base 120. Thus, for example, if the MEMS scanner 101*b* or 101*c* is driven with a V axis (or X axis) used as a rotation axis, the second base 120 interferes with the second middle yoke 820*b* or 820*c*. As a method of avoiding such interference, for example, there is a possible method in which the second middle yoke 820*b* or 820*c* is disposed at a position away from the second base 120; however, the magnetic flux concentration function by the second middle yoke 820*b* or 820*c* is reduced by the large distance.

Figure 10B:
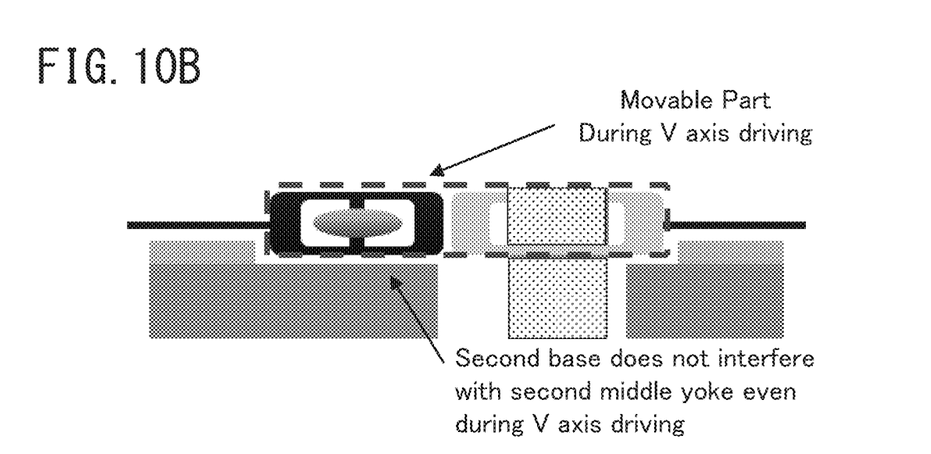

On the other hand, in FIG. 10B, according to the example, the second middle yoke 820 and the second base 120 are not located to planarly overlap each other. Thus, for example, even if the MEMS scanner 101 is driven with the V axis (or X axis) used as a rotation axis, it is possible to avoid the interference between the second base 120 and the second middle yoke 820.

As explained above, according to the MEMS scanner 101 in the example, the plurality of magnets and yokes are arranged in an aspect in which the interference with the MEMS scanner 101 can be avoided during driving, and the magnetic fields with good balance are applied to the coil 300. Therefore, the preferable driving of the MEMS scanner 101 is realized.

The MEMS scanner 101 according to the example described above can be applied to various electronic devices, such as, for example, a head-up display, a head-mount display, a laser scanner, a laser printer, and a scanning type driving apparatus. Therefore, the electronic devices are also included in the scope of the present invention.

The present invention is not limited to the aforementioned embodiments and examples, but various changes may be made, if desired, without departing from the essence or spirit of the invention which can be read from the claims and the entire specification. A driving apparatus which involves such changes is also intended to be within the technical scope of the present invention.

DESCRIPTION OF REFERENCE NUMERALS 10 support layer
20 active layer
30 BOX layer
40 metal layer
101 MEMS scanner
110 first base
120 second base
150, 160 V torsion bar
210 spring part
220 wiring spring part
225 connection wire
300 coil
400 mirror
450 H torsion bar
500 wire
600 yoke
650 lower yoke
710 first magnet
720 second magnet
730 third magnet
740 fourth magnet
810 first yoke
820 second yoke
830 third yoke
840 fourth yoke

The invention claimed is:

1. A driving apparatus comprising:
a first base part which is coupled to the driven part;
a coil disposed on the first base part;
a first magnet disposed on one side of the coil;
a second magnet disposed on an opposite side of the first magnet as viewed from the coil;
a first middle yoke provided on a surface of the first magnet opposed to the coil; and
a second middle yoke provided on a surface of the second magnet opposed to the coil, wherein
the first magnet is smaller than the second magnet, and
the first middle yoke is located closer to the coil than the second middle yoke is.

2. The driving apparatus according to claim 1, wherein the second magnet is disposed on the driven part side as viewed from the coil.

3. The driving apparatus according to claim 2, wherein the first magnet has a first part and a second part, the first part being provided along a first side of the first base part that is not opposed to the driven part, the second part being provided along a second side adjacent to the first side,
the second magnet has a third part and a fourth part, the third part being provided along a third side of the first base part that is opposed to the driven part, the fourth part being provided along a fourth side adjacent to the third side,
the first part is smaller than the third part, and
a part of the first middle yoke provided on a surface of the first part is located closer to the coil than a part of the second middle yoke provided on a surface of the third part is.

4. The driving apparatus according to claim 1, wherein the first middle yoke and the second middle yoke are arranged not to planarly overlap the first base part and the driven part.

5. The driving apparatus according to claim 1, further comprising a yoke inserted through an opening of the first base part.

6. The driving apparatus according to claim 1, wherein the driven part is coupled to the first base part via a second base part which rotatably supports the driven part.

7. The driving apparatus according to claim 2, wherein the first middle yoke and the second middle yoke are arranged not to planarly overlap the first base part and the driven part.

8. The driving apparatus according to claim 3, wherein the first middle yoke and the second middle yoke are arranged not to planarly overlap the first base part and the driven part.

9. The driving apparatus according to claim 2, further comprising a yoke inserted through an opening of the first base part.

10. The driving apparatus according to claim 3, further comprising a yoke inserted through an opening of the first base part.

11. The driving apparatus according to claim 4, further comprising a yoke inserted through an opening of the first base part.

* * * * *